(12) United States Patent
Olmstead

(10) Patent No.: US 9,684,052 B2
(45) Date of Patent: Jun. 20, 2017

(54) METHOD OF MEASURING AND ASSESSING A PROBE CARD WITH AN INSPECTION DEVICE

(71) Applicant: Rudolph Technologies, Inc., Flanders, NJ (US)

(72) Inventor: Greg Olmstead, Sammamish, WA (US)

(73) Assignee: Rudolph Technologies, Inc., Wilmington, MA (US)

( * ) Notice: Subject to any disclaimer, the term of this patent is extended or adjusted under 35 U.S.C. 154(b) by 132 days.

(21) Appl. No.: 14/298,539

(22) Filed: Jun. 6, 2014

(65) Prior Publication Data

US 2015/0054534 A1 Feb. 26, 2015

Related U.S. Application Data

(63) Continuation-in-part of application No. 14/282,565, filed on May 20, 2014, which is a continuation of application No. 13/093,456, filed on Apr. 25, 2011, now Pat. No. 8,729,917.

(60) Provisional application No. 61/327,220, filed on Apr. 23, 2010.

(51) Int. Cl.
*G01R 31/00* (2006.01)
*G01R 35/00* (2006.01)
*G01R 31/28* (2006.01)

(52) U.S. Cl.
CPC ......... *G01R 35/00* (2013.01); *G01R 31/2891* (2013.01)

(58) Field of Classification Search
CPC ....... G01R 35/00; G01R 31/2891; G01R 3/00
USPC .................................................... 324/756.03
See application file for complete search history.

(56) References Cited

U.S. PATENT DOCUMENTS

| | | | |
|---|---|---|---|
| 4,035,723 A | 7/1977 | Kvaternik | |
| 6,023,172 A * | 2/2000 | Krivy | G01R 31/2887 324/750.23 |
| 6,118,894 A * | 9/2000 | Schwartz | G01R 1/07307 324/750.23 |
| 6,590,720 B2 | 7/2003 | Oba | |
| 6,594,450 B1 | 7/2003 | Kao | |
| 6,710,798 B1 | 3/2004 | Hershel et al. | |
| 6,714,363 B2 | 3/2004 | Sasaki et al. | |
| 7,119,566 B2 * | 10/2006 | Kim | G01R 31/2887 324/750.19 |
| 7,561,353 B2 | 7/2009 | Shirakata | |
| 2001/0019275 A1 | 9/2001 | Pace et al. | |
| 2003/0178988 A1 | 9/2003 | Kim | |

(Continued)

FOREIGN PATENT DOCUMENTS

| | | |
|---|---|---|
| DE | 69800756 | 8/2001 |
| DE | 10131665 | 1/2003 |
| WO | 03/049038 | 6/2003 |

OTHER PUBLICATIONS

International Search Report and Written Opinion for Int'l Application No. PCT/US15/34470 mailed Sep. 14, 2015 (10 pgs).

*Primary Examiner* — Daniel Miller
(74) *Attorney, Agent, or Firm* — Dicke, Billig & Czaja, PLLC

(57) ABSTRACT

A method of assessing functionality of a probe card includes providing a probe card analyzer without a probe card interface, removably coupling a probe card having probes to a support plate of the probe card analyzer, aligning a sensor head of the probe card analyzer with the probe card, and measuring a component of the probes with the sensor head.

22 Claims, 10 Drawing Sheets

(56) References Cited

U.S. PATENT DOCUMENTS

| | | |
|---|---|---|
| 2004/0207424 A1 | 10/2004 | Hollman |
| 2009/0262441 A1 | 10/2009 | Kaneta et al. |
| 2010/0321056 A1* | 12/2010 | Strom ................ G01R 31/2887 324/755.01 |
| 2012/0098563 A1 | 4/2012 | Gunderson et al. |
| 2014/0021970 A1 | 1/2014 | Endres et al. |

* cited by examiner

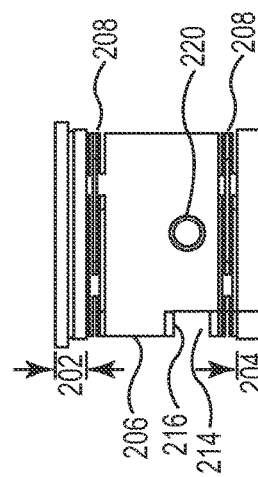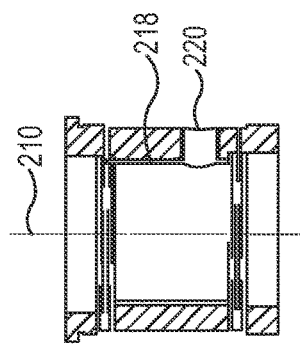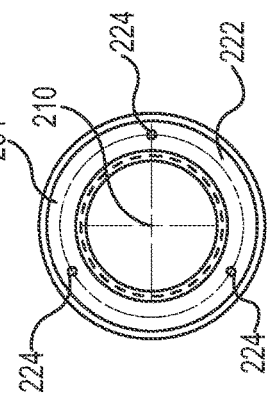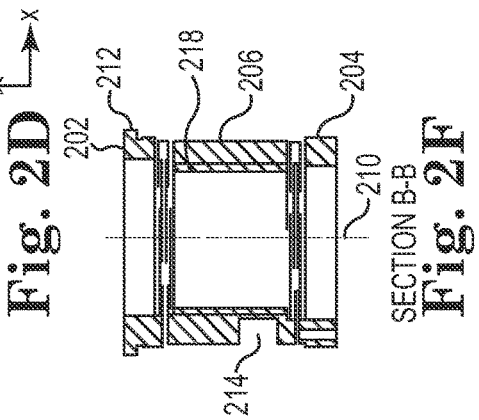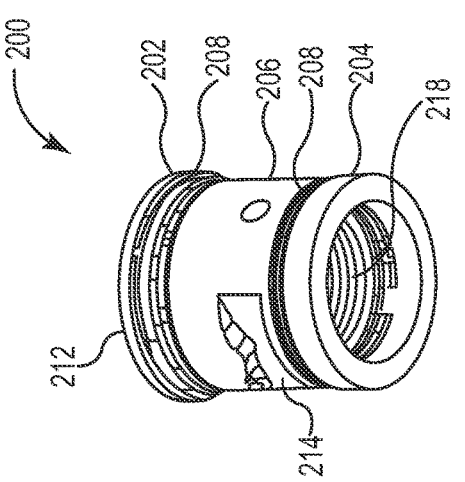

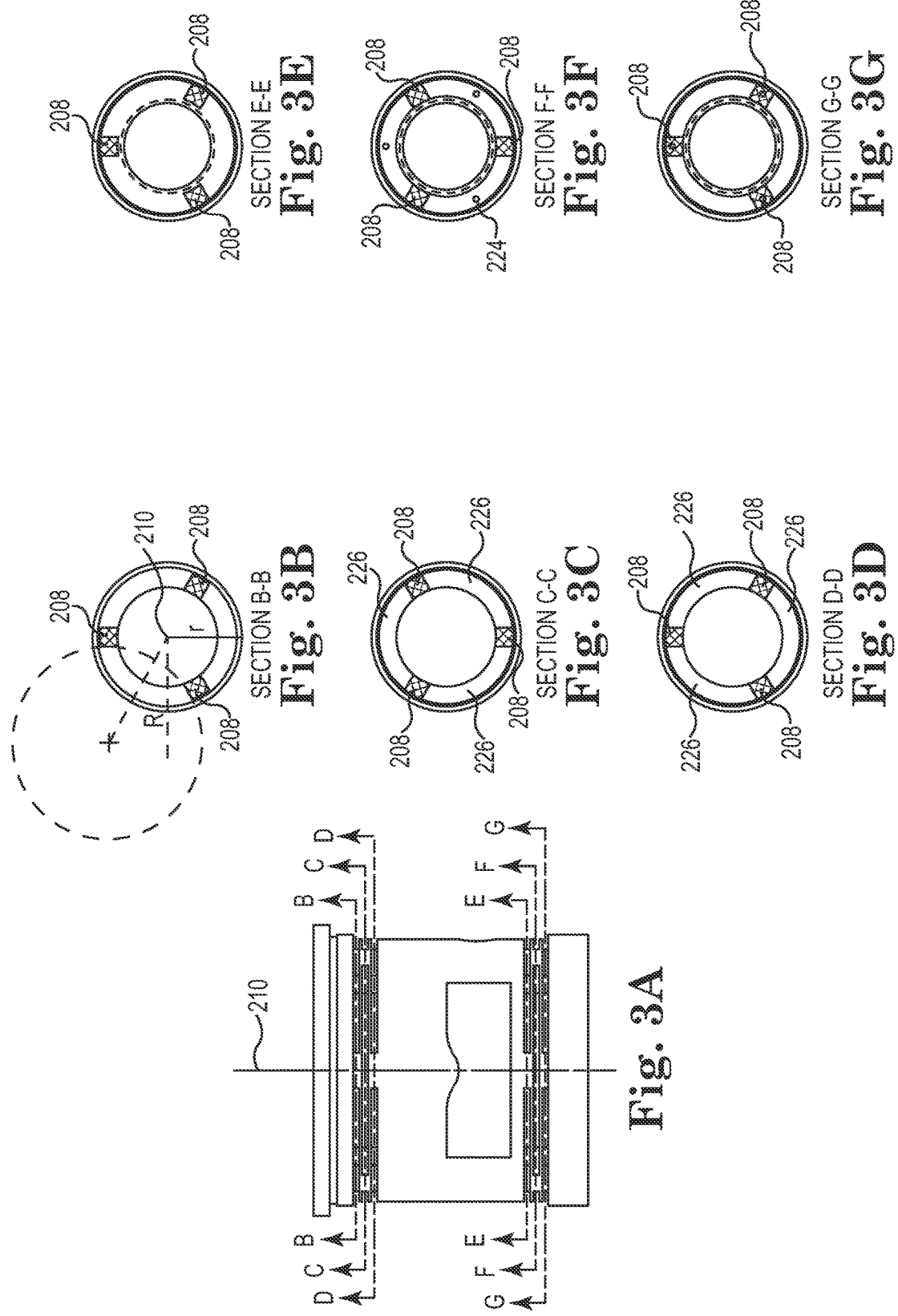

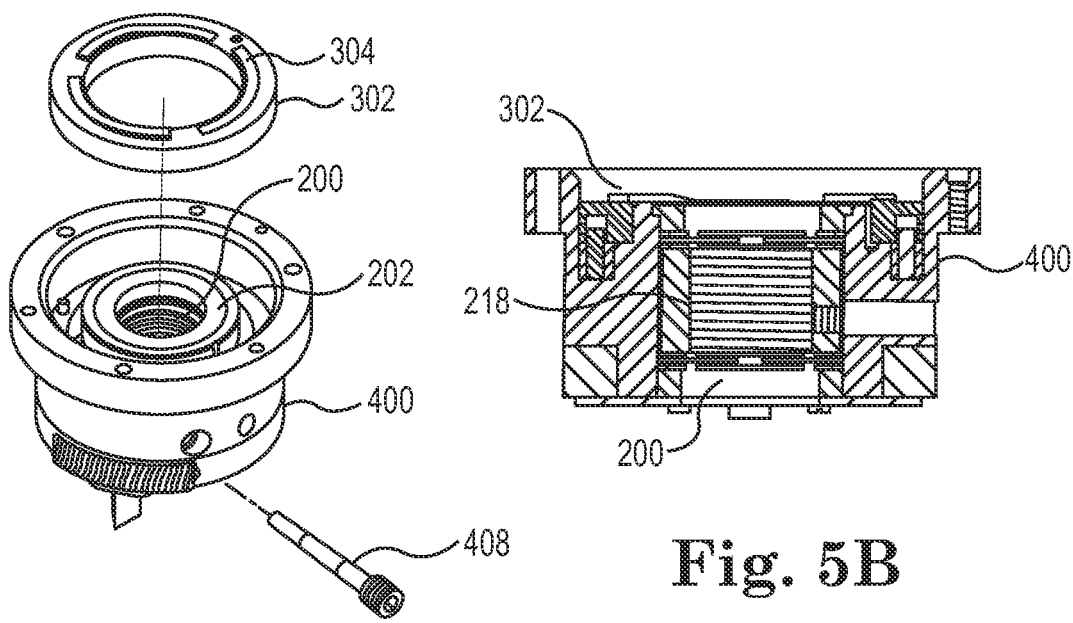
Fig. 5A
Fig. 5B
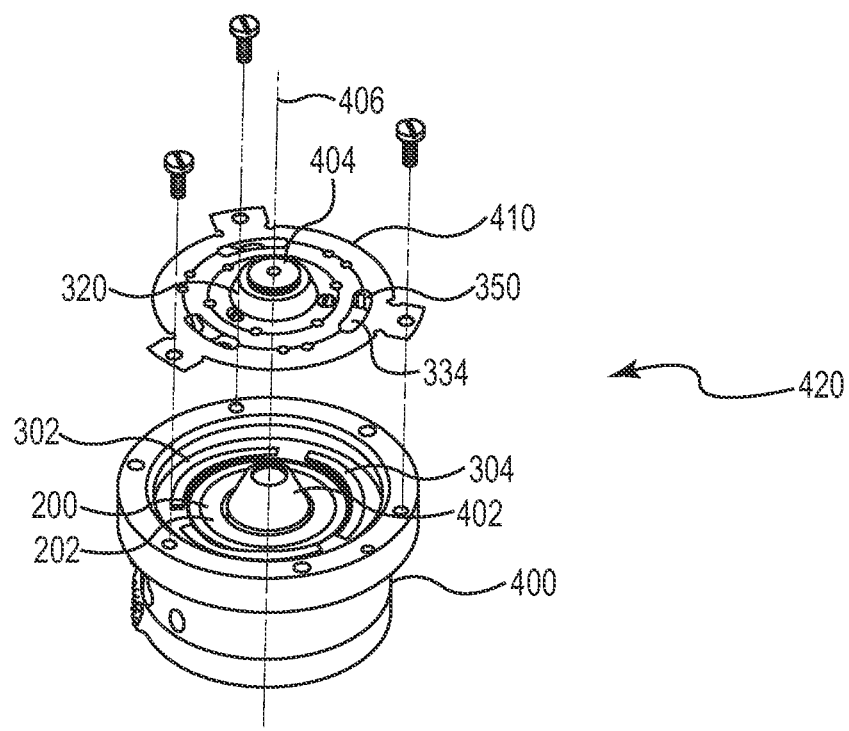
Fig. 5C

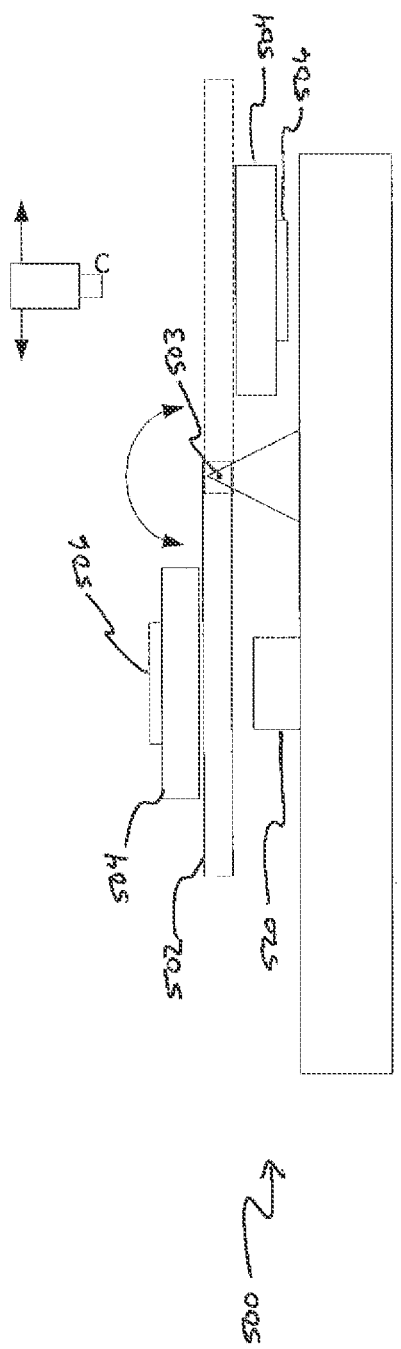
Fig. 6 (Prior Art)
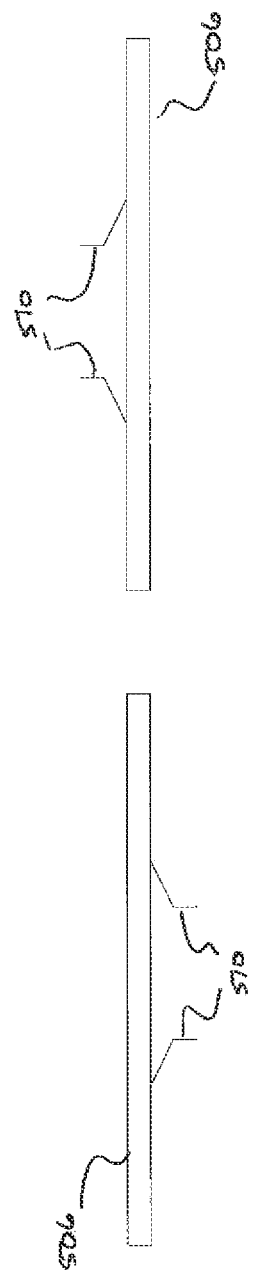
Fig. 7A
Fig. 7B

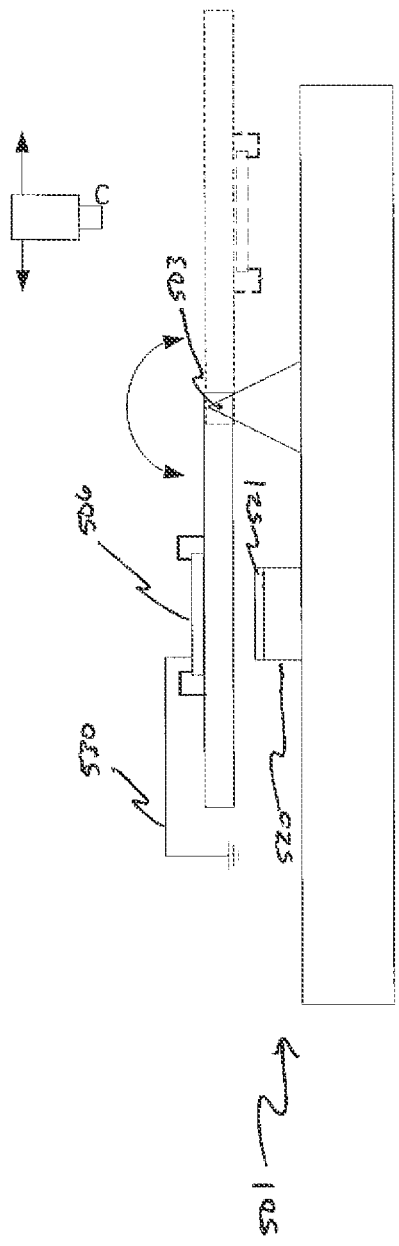
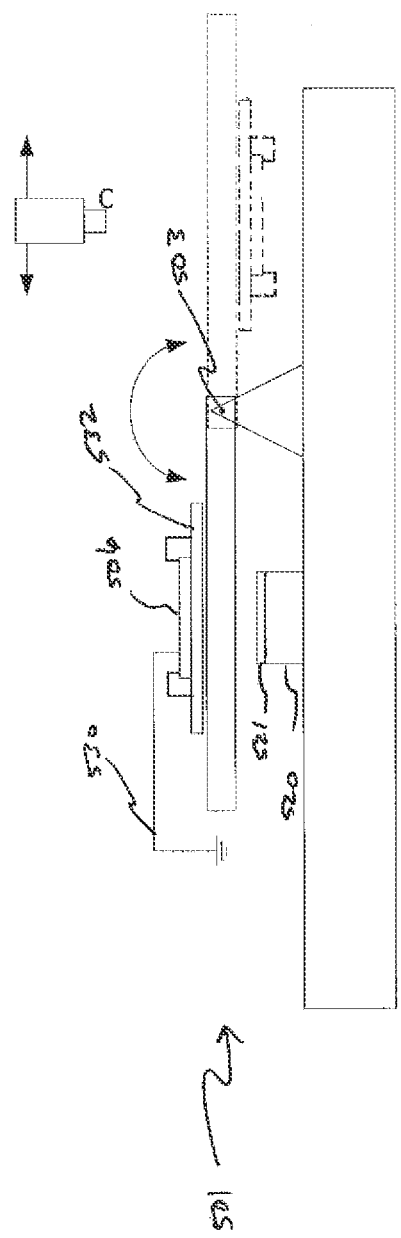

METHOD OF MEASURING AND ASSESSING A PROBE CARD WITH AN INSPECTION DEVICE

CROSS-REFERENCE TO RELATED APPLICATIONS

This application is a Continuation-In-Part of patent application Ser. No. 14/282,565, filed May 20, 2014, entitled "Inspection Device with Vertically Moveable Assembly", which is a Continuation of patent application Ser. No. 13/093,456, filed Apr. 25, 2011, now U.S. Pat. No. 8,729,917 entitled "Inspection Device with Vertically Moveable Assembly", which claims the benefit of U.S. Provisional Patent Application Ser. No. 61/327,220, filed Apr. 23, 2010, entitled "Inspection Device with Vertically Moveable Assembly", the entire teachings of the foregoing applications are incorporated herein by reference.

BACKGROUND

Probe cards used in testing integrated circuits during their manufacture require periodic assessment and maintenance to avoid damaging the integrated circuits. As part of the assessment and maintenance of probe cards, optical inspection devices are often used to measure the X, Y and Z positions of probes in a probe card in order to determine whether the probes are planar and whether they are properly aligned with the set pattern of bond pads on a semiconductor wafer that the probes are intended to address. The devices may also predict the length and location of a scrub mark that would be formed in a bond pad based on measurements made using a fiducial plate (i.e. check plate) in lieu of a semiconductor wafer with a bond pad. Other assessments of the probe cards may also be desired.

A probe card analyzer can be used to assess the performance of the probe cards. Many different tester platforms of probe card analyzers are available. A specific tester platform with specific tester interface is typically related a specific probe card configuration making it necessary, in some situations, to have multiple probe card analyzers. A probe card interface (PCI) is a very expensive part of the overall probe card analyzer.

Even though each probe is very small, the force needed to achieve the appropriate amount of scrubbing is several grams. Where there are hundreds or thousands of probes in a single probe card, the amount of force needed to overtravel the probes to achieve a proper scrub mark can be very high. Often, overtravel of all the probes occurs at once. For example, the device may have a conductive check plate that is used to measure the Z height of each separately wired probe and the Z height of the lowest of a group of bussed probes (some probes are wired together making it impossible to electrically separate the signals from each one). In this Z height measurement process, the check plate is driven into contact with all of the probes and the Z height of the check plate is recorded when each probe (or group of probes) makes electrical contact.

In order to measure the XY position of probes, also referred to as alignment of the probes, images of the probes may be captured. In some instances, probes are located within the image and linear encoders of the stages on which the camera is mounted are used to help determine the XY position. In other instances, the position of the probes is related in an image to fiducial marks that are formed on windows. Due to the large forces involved in overtravelling all of the probes into contact with the fiducial plate, deflections in the inspection system and the probe card can result. Thus, it is desirable to minimize the applied forces.

In addition to minimizing the amount of force applied to a probe card, it is desirable to minimize the amount of wear to which a probe card and its probes are subject. For example, in systems such as that described in U.S. Pat. Nos. 5,657,394 and 6,118,894 it is necessary for probes to touch down each time an optical alignment measurement is taken. Even considering that multiple probes may be imaged together, where a probe card has many hundreds or thousands of probes, each probe and the probe card will be subjected to much unnecessary wear that inevitably leads to a shorter life for a probe card and its probes.

Accordingly, there is a need for a less expensive system and method of performing an assessment of probe cards and a mechanism for analyzing probe cards that minimizes stresses placed on a probe card and its probes and which similarly minimizes wear to a probe card and its probes.

SUMMARY

Some aspects in accordance with principles of the present disclosure relate to a method of assessing functionality of a probe card. The method includes providing a probe card analyzer without a probe card interface, removably coupling a probe card having probes to a support plate of the probe card analyzer, aligning a sensor head of the probe card analyzer with the probe card, and measuring a component of the probes with the sensor head.

Other aspects in accordance with principles of the present disclosure relate to a method of assessing a probe card. The method includes providing a probe card analyzer including a support plate and a sensor head, coupling an adapter to the support plate, coupling a probe card having probes to the adapter, addressing the probe card with the sensor head through an aperture of the support plate, and performing a mechanical measurement of the probes.

Other aspects in accordance with principles of the present disclosure relate to a method of monitoring a probe card. The method includes establishing a first service interval for a probe card, establishing a second service interval for the probe card, removably coupling the probe card to a probe card analyzer, and assessing the probe card without using a probe card interface during the first service interval.

BRIEF DESCRIPTION

FIGS. 2A-2G are embodiments of an objective focus flexure according to the present disclosure.

FIGS. 3A-3G are embodiments of an objective focus flexure according to the present disclosure.

FIGS. 5A-5C are embodiments of a housing, carrier, actuator assembly according to the present disclosure.

FIG. 6 is a schematic side view of a prior art probe card analyzer.

FIGS. 7A and 7B are schematic illustrations of embodiments of a probe.

FIG. 8 is a schematic side view of a probe card analyzer having a probe card according to one embodiment.

FIG. 9 is a schematic side view of a probe card analyzer according to another embodiment.

DETAILED DESCRIPTION

Figure 1:
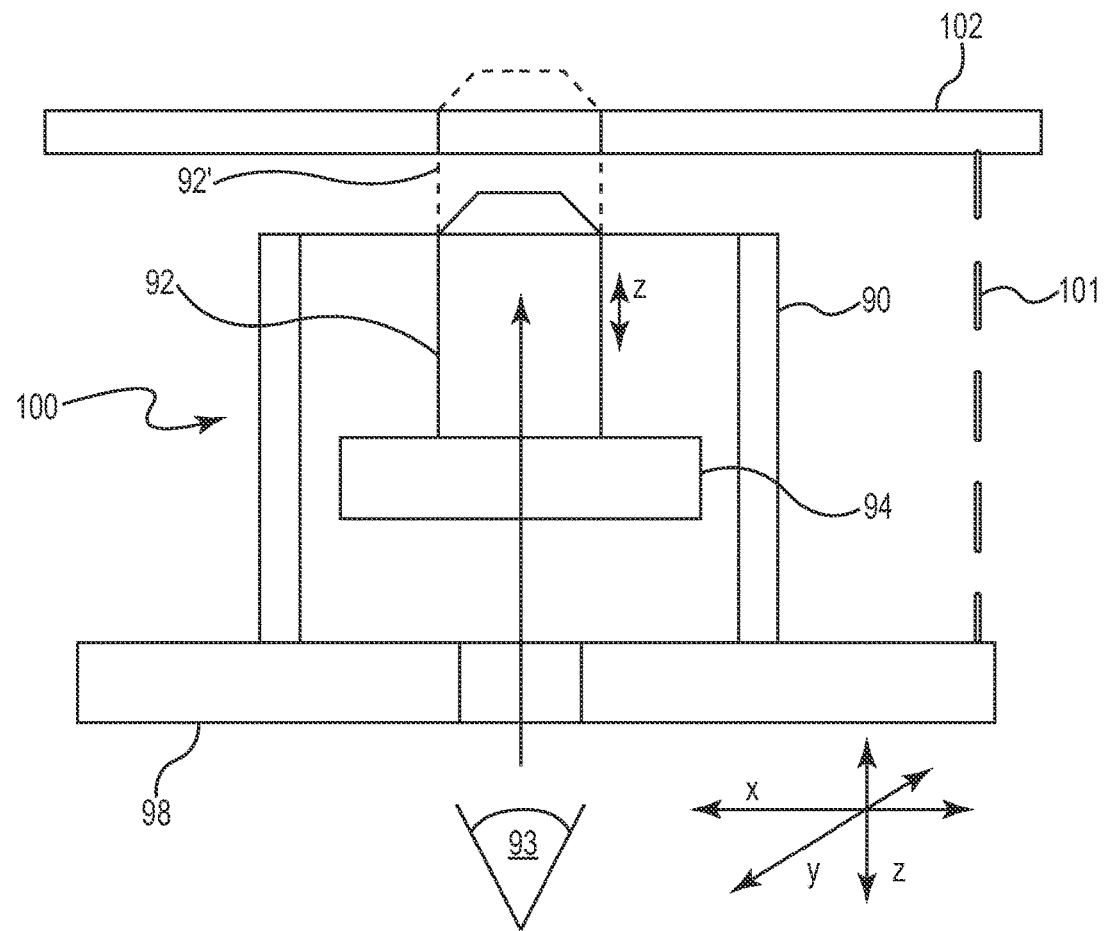
FIG. 1 is a schematic side view of an embodiment of an inspection device according to the present disclosure.

Some aspects in accordance with the present disclosure related to an inspection device for use with a check plate and probe card. With this in mind one embodiment of an inspection device 100 is generally illustrated in FIG. 1 and includes a check plate 102 mounted independently from a reciprocating mechanism that cycles the window/pin vertically up and down. This minimizes the complexity and the flexion of the entire assembly due to the effect of the other. Both the check plate and the reciprocating mechanism are coupled to XY and Z stages.

FIG. 1 is a schematic illustration of one embodiment of an inspection device 100. While the inspection device 100 will be described as it is used in the inspection of semiconductor probe card pins, it is to be kept in mind that the inspection device 100 may have applications outside of this specific use. In general the inspection device 100 has an outer body or housing 90, a carrier 92, and an actuator 94.

The carrier 92 is mounted within the housing 90 and reciprocates vertically in the Z direction as noted by the arrow adjacent thereto. The carrier 92 moves between a first position, a retracted position, identified by numeral 92 and a second position, an extended position, identified by numeral 92'. In one embodiment, the carrier 92 is biased from its extended position 92' to its retracted position 92 by gravity. In the second position 92', an upper surface of the carrier 92 may contact an object that is under inspection. In some embodiments, this may be a probe or pin of a probe card. In other embodiments, the object under inspection (which is not shown in FIG. 1) may be some other object as the application requires. Note that the upper surface of the carrier 92 may deflect the object under inspection, but in all cases, moving the upper surface of the carrier 92 in contact with the object under inspection or at least moving the carrier close to the object under inspection will help to locate the object under inspection in the Z direction. That is, where there is contact with the upper surface of the carrier 92, the exact position of the object under inspection is known (even if contact has deflected or deformed the object). Similarly, if there is no contact between the upper surface of the carrier 92 and the object under inspection, one can know that the object is positioned outside of a range of desired or acceptable positions. Contact between the carrier 92 and the object under test may be determined by electrical contact, as where the upper surface of the carrier 92 is provided with a conductive coating or where the upper surface of the carrier 92 is itself conductive. Contact may also be determined optically by viewing the object under test through the upper surface of the carrier 92. Note that where the upper surface of the carrier 92 is a substantially transparent window and where the inspection system 100 provides the necessary optical path, the object under inspection is on an optical axis that passes through a central passage through which light may pass of the carrier 92, and a camera or other imaging device 93 may be used to view the object under inspection through the inspection system 100.

In one embodiment, the housing 90, the carrier 92, and the actuator 94 of the inspection system 100 are mounted on a stage 98 that is moveable in at least an XY plane. Generally the object that is under test will remain stationary, though it is to be understood that in some applications, one skilled in the art may reverse this arrangement and make the object under inspection move in at least an XY plane with respect to the housing 90, the carrier 92, and the actuator 94. The stage 98 may also move in the Z direction, although in some embodiments and applications of the inspection system 100, the reciprocating motion of the carrier 92 may suffice for the all movements in the Z direction. Note that where contact is desired between the object under inspection and a check plate 102, it may be desirable to couple the check plate 102 to the stage 98 (as indicated by dashed line 101) such that the check plate 102 and the stage 98 move together. While shown in close proximity to one another in FIG. 1 (the check plate 102 having an aperture throughough to allow the carrier 92 to extend through and above the upper surface of check plate 102), the check plate 102 and housing 90/carrier 92 assembly on a stage may be spatially separated such that the check plate 102 has an unbroken upper surface. In many embodiments, it may be desirable to avoid physically coupling the check plate 102 to the housing 90 to avoid deformation in either the housing 90/carrier 92/actuator 94 assembly and/or the check plate 102 due to contact between the object under inspection and either or both of the housing 90/carrier 92/actuator 94 assembly and/or the check plate 102.

As the embodiment shown in FIG. 1 is necessarily schematic in nature, one will readily appreciate that the inspection system 100 shown may be embodied in different physical modes.

With the above in mind, the inspection device 100 includes an objective focus flexure 200 and a cam assembly 300 which are described below in greater detail. In general terms, the objective focus flexure 200 holds the objective for focusing operates in conjunction with the reciprocating cam assembly 300 to ensure proper focus. Often a focal plane of the inspection device 100 will be fixed, but the position of the focal plane may also be modified. There are many uses for this flexure focusing device aside from probe card inspection. Any application where focal adjustment is desired might benefit from the present disclosure, including medical devices, camera or video devices, and various other manufacturing, testing and quality control devices.

With reference to FIGS. 2A-2G and 3A-3G, the objective focus flexure 200 is a hollow cylindrical component. The objective focus flexure 200 has a top section 202, an opposing bottom section 204, and a middle section 206 between the top section 202 and the bottom section 204. Resilient couplings such as flexure points 208 are positioned at the regions of interface between the middle section 206 and the top section 202 as well as between the middle section 206 and the bottom section 204. The flexure points 208 are resilient in an axial direction of the objective focus flexure 200 and are substantially rigid in a radial direction of the objective focus flexure 200. In one embodiment, the objective focus flexure 200 is made of a single piece of material.

In one embodiment, the top section 202 includes a collar or flange 212 extending to the exterior of the objective focus flexure 200. The outer diameter of the collar/flange 212 is greater than the outer diameter of the body of the objective focus flexure 200. In one embodiment, the interior diameter is consistent through the top section 202 including the collar 212.

The middle section 206 includes a recess 214. In one embodiment, the depth "d" of the recess 214 is tapered into the body of the objective focus flexure 200. The recess 214 follows linearly along the x-axis while the body of the objective focus flexure 200 is circular. In one embodiment, the recess 214 includes a constriction point 216 along a z-axis. In one embodiment, the middle section 206 is at least partially threaded on an inner circumference 218. In one embodiment, the middle section 206 includes a set screw opening 220 to aid in setting and aligning the objective focus flexure 200 within a toggle assembly (not shown).

With reference to FIG. 2G, the bottom section 204 has a generally planar bottom face 222. In one embodiment, screw holes 224 at the bottom face 222 are included for attachment of the objective lens flexure 200 into the toggle assembly.

As noted above, flexure points 208 are established at locations along the circumference of the objective focus flexure 200 at opposing ends of the middle section 206. Multiple cross-sections though the regions of the flexure points 208 are illustrated in FIGS. 3B-3G. In one embodiment, each of the flexure points 208 are configured to an extended radius "R" originated from the objective axis 210 of the objective focus flexure 200 to a point oriented exterior of the flexure, respectively. In one embodiment, the extended radius "R" is larger than the radius "r" of the exterior of the objective focus flexure 200. (See, e.g., FIG. 3B)

In one embodiment, the flexure points 208 are configured on a planar level and evenly spaced along the circumference of the objective focus flexure 200. FIGS. 3B-3G represent multiple planar levels according to one embodiment of the objective focus flexure 200. In one embodiment, there are at least two planar levels of flexure points 208, with each planar level including flexure points 208 offset from the adjacent planar level. In one embodiment, the flexure points 208 are evenly staggered along the circumference. In one embodiment, where there are at least three adjacent planar levels, alternating levels includes flexure points 208 at the same locations along the circumference, e.g. the first and third level include flexure points identically located along the circumference. (See FIGS. 3B and 3D, for example) In one embodiment, opposing sides of the flexure points 208 correspond to the outer circumference. The flexure points 208 connect on upper and lower faces to the adjacent level or the top section 202 or bottom section 204. Along the circumference, between the flexure points 208, voids 226 are formed by the absence of material. The voids 226 form a clearance within the levels/planes. In one embodiment, the voids 226 cover a larger circumferential area than the flexure points 208. In a preferred embodiment, there are three adjacent planar levels which constrain five of six degrees of freedom.

In one embodiment, to adjust the focal point in position with the objective focus flexure 200, the middle section 206 adjusts along the optical axis 210 and the top section 202 and bottom section 204 remain fixed. Alternatively, the top section 202 and bottom section 204 adjust along the optical axis 210 and the middle section 206 remains fixed.

Figure 4A:
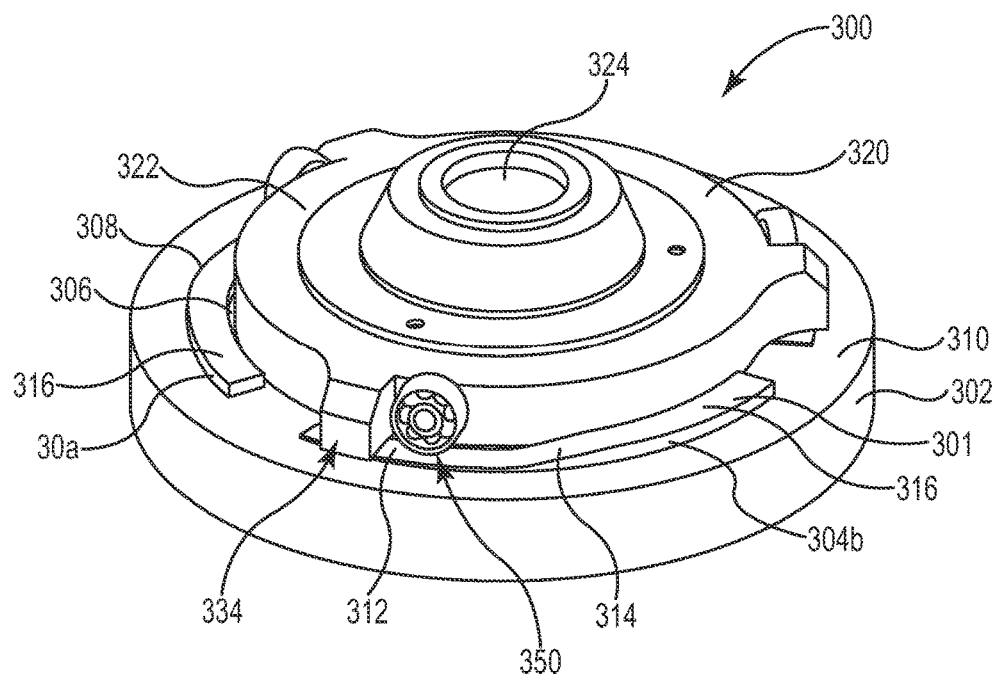
FIGS. 4A-4D are embodiments of a cam assembly according to the present disclosure.
Figure 4B:
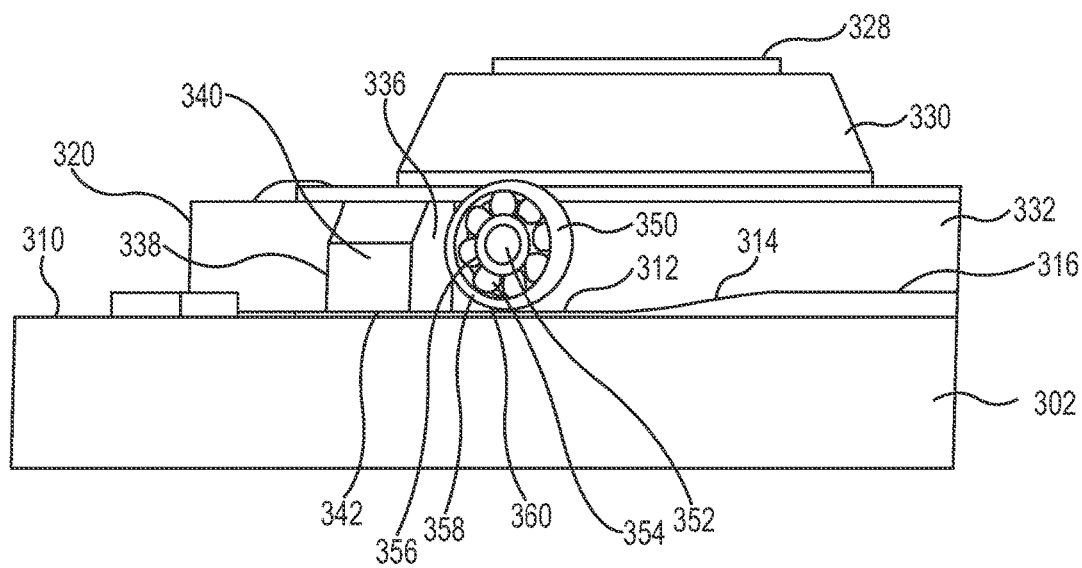
Figure 4C:
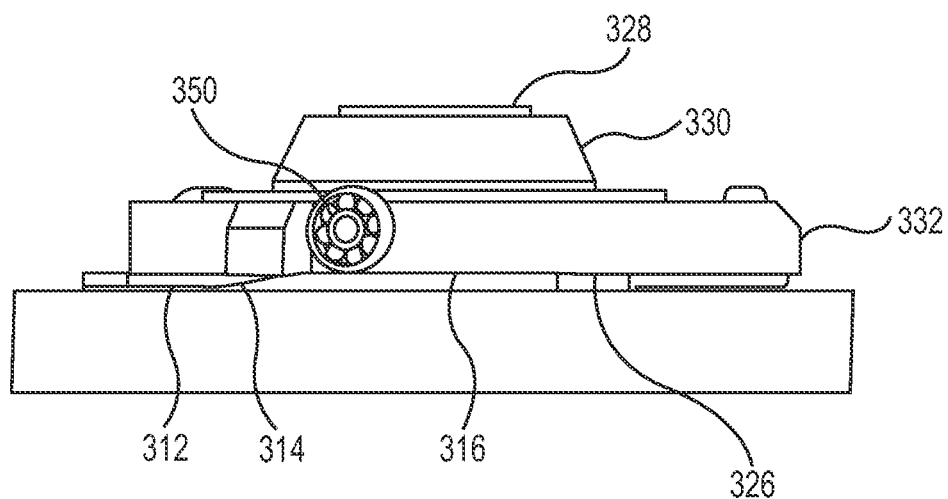
Figure 4D:
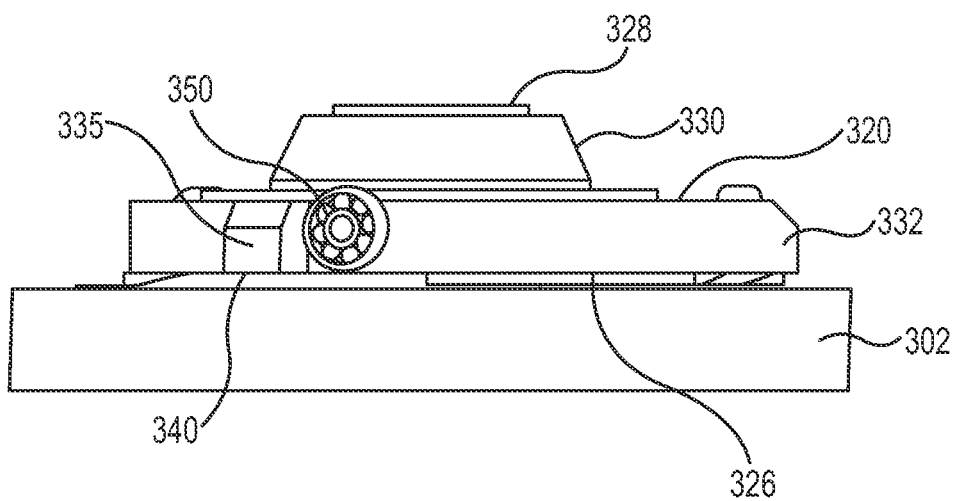

Turning now to an embodiment of the cam assembly 300 illustrated in FIGS. 4A-4D, an actuator 302 is disk shaped, hollow, cylindrical bodied rotary cam. The actuator 302 includes an open interior along a center axis. The cam assembly 300 has an actuating surface 301 including at least one ramp 304. The at least one ramp 304 has an inner radius 306 and an outer radius 308 and extends from a first planar surface 310 of the actuator 302. In one embodiment, the at least one ramp 304 includes an initial stepped surface 312, an inclining surface 314, and a terminating raised platform 316. In one embodiment, the at least one ramp 304 is a series of ramps 304 arranged in a circular pattern to form a ring-like shape. With particular reference to FIG. 4C, in one embodiment, the series of at least one ramp 304 are arranged such that the terminating raised platform 316 of a first ramp 304a is followed by the initial stepped surface 312 of a second ramp 304b. In one embodiment, there is a gap between each of the at least one ramps 304 wherein a length of the planar surface 310 is exposed. In one embodiment, the at least one ramps 304 are spaced equidistant from one another in a series.

In one embodiment, the inner radius 306 of the actuator 302 is configured to fit along the perimeter radius of a carrier 320. In one embodiment, the outside radius 308 of the at least one ramp 304 is smaller than the outside radius of the carrier 320, although they may be essentially equal. In one embodiment, the carrier 320 includes a multi-tiered top surface 322 and a hollow core 324 extending from the top surface 322 to an opposing bottom surface 326. In one embodiment, the top surface 322 includes a top ring 328, a beveled cone 330, and a lower ring 332 arranged concentrically extending from the hollow core 324, respectfully. The carrier 320 has an outer perimeter from which at least one hard point 334 projects from. In one embodiment, and with particular reference to FIG. 4B, the at least one hard point 334 includes a leading edge 336, a following edge 338, and an outer edge 340 extending between the leading edge 336 and the following edge 338. In one embodiment, the at least one hard point 334 includes a bottom surface 342 which is planar with the bottom surface 326 of the window carrier 320. The carrier 320 may be assembled or formed from a single piece of suitable material.

With continued reference to FIGS. 4A-4D, at least one bearing assembly 350 has a shaft 352 extending from a center shaft opening in a bearing body 354. In one embodiment, the bearing body 354 is rotatable about the shaft 352. In one embodiment, the bearing body 354 contains bearing balls between an inner diameter wall 356 and an exterior diameter wall 358. In one embodiment, the bearing body 354 includes an open face and a closed face. In one embodiment, the at least one bearing assembly 350 is coupled to the carrier 320 with the distal end of the shaft 352 inserted into a hole in the outer diameter of the carrier 320 adjacent to the at least one hard point 334. In one embodiment, the open face of the at least one bearing body 354 is proximal to the proximal end of the shaft 352. In one embodiment, the closed surface is adjacent to, but not in contact with, the outer perimeter of the carrier 320 and the leading edge 336 of the hard point 334. In one embodiment, the bearing assembly 350 is positioned such that an outer diameter 360 is not flush with the bottom surface 342 of the hard point 334. In one embodiment, the outer edge 340 of the at least one hard point 334 extends laterally beyond the exterior radius 308 of the at least one ramp 304.

The actuator 302 is rotatable relative to the carrier 320. In one embodiment, as the actuator 302 rotates in a counterclockwise direction, the carrier 320 remains axially fixed. In this rotational manner, the bearing assembly 350 precedes each hard point 334. During rotation, the hard point 334 travels over the exposed first planar surface 310, then the bearing assembly 350 contacts the stepped surface 312 of the ramp 304 until the hard point 334 contacts the stepped surface 312, whereby the carrier 320 is axially raised a distance equally to the height of the stepped surface 312 above the first planar surface 310. In continuing the rotation, the bearing 350 intercepts the inclining surface 314 of the ramp 304 and the hard point 334 lifts free. After the bearing 350 crests the terminating raised platform 316, the leading edge 336 of the hard point 334 makes contact with the terminating raised platform 316. As the actuator 302 continues to rotate, the leading edge 336 of the hard point 334 travels over the upper edge of the terminating raised platform 316 until the bearing 350 lifts free. As the actuator 302 rotates to its final position, the bottom surface 342 of the hard point 334 slides along the terminating raised platform 316, further raising the carrier 320 above the actuator 302. In one embodiment, there is a gap (e.g., 3 mils) between the outer diameter 360 of the bearing assembly 350 and planar surfaces of the at least one ramp 304 and the planar surface 310 when the hard point 334 is in contact with the actuating surface 301.

As assembled, for example in a semiconductor inspection device embodied in FIG. 5B, the objective focus flexure 200, as a focusing mechanism, is assembled within the central passage of a housing 400. In one embodiment, the middle section 206 of the objective focus flexure 200 is coupled to the housing 320 and the top section 202 and the bottom section 204 are free to move with respect to the housing 400. In another embodiment, the top section 202 and the bottom section 204 of the objective focus flexure are coupled to the housing 400 and the middle section 206 is free to move with respect to the housing 400. The actuator 302 is positioned within the housing 400 at the top end 202 of the objective focus flexure 200.

The actuator 302 is positioned within the housing 400 such that at least one actuating surface 301 of the actuator 302 may selectively bear against at least one bearing surface of the carrier 320, the actuator 302 being actuatable between a first position in which the bearing surface permits the carrier 320 to remain or return to its retracted position and a second position in which force is exerted by the at least one actuating surface against the at least one bearing surface of the carrier 320 to move the carrier 320 to its extended position. An objective 402 is inserted within the objective focus flexure 200 and the housing 400. The objective 402 is fit inside the objective focus flexure 200 and moveably secured with by threading the objective 402 into the middle section threads 218 of the objective focus flexure 200. Where the middle section 206 of the objective focus flexure 200 is coupled to the carrier 92, the objective 402 is coupled to the middle section 206 such that the middle section 206 of the objective focus flexure 200 moves along an optical axis 406 of the optical element. Alternatively, where the top section 202 and the bottom section 204 are coupled to the carrier 320, the objective 402 is coupled between the top section 202 and the bottom section 206 of the objective focus flexure 200 such that the top section 202 and the bottom section 206 of the objective focus flexure 200 move in conjunction with one another and with the objective 402 along an optical axis 406 of the objective 402. The carrier 320, with a window 404 secured to the top ring 328 is coupled to a toggle assembly 420. As illustrated in FIGS. 5A and 5C, a resilient member 410 is coupled between the carrier 320 and the housing 400, the resilient member 410 being resilient in an axial direction defined by movement of the carrier 320 between its retracted and extended positions and largely rigid with respect to relative rotation of the carrier 320 within the housing 400 around the axial direction. The window 404 is assembled over a projecting end of the objective 402 oriented proximal to the top section 202 of the objective focus flexure 200. The objective 402 assists in maintaining the top section 202 and the bottom section 204 in a planar parallel relation to one another.

With reference to the above, rotation of the actuator 302 rotates causing the carrier 320 and the window 404 to vertically adjust as the hard points 334 and the bearings 350 move along the inclined ramps 304. An objective focus mechanism 408 is an adjustment mechanism that engages the objective focus flexure 200 at the recess 214 within the toggle assembly 420 and is adjusted along the optical axis 406. In one embodiment, the objective focus mechanism 408 is coupled between the housing 400 and at least one of the top section 202 and the bottom section 204 of the objective focus flexure 200, and actuation of the objective focus mechanism 408 results in relative translation of the at least one of the top section 202 and the bottom section 204 with respect to the housing 400. In another embodiment, the objective focus mechanism 408 is coupled between the housing 400 and the middle section 206 of the objective focus flexure 200, and actuation of the objective focus mechanism 408 results in relative translation of the middle section 206 with respect to the housing 400. The flexure points 208 of the objective focus flexure 200 deform upon actuation and there is substantially zero deflection from a planar parallel position.

The cam assembly 300 and the objective flexure focus 200, in accordance with principles of the present disclosure, can be assembled and used as part of an inspection system assembly. Other aspects of the inspection system assembly are described below.

FIG. 6 illustrates a prior art version of a probe card analyzer 500 having a support table 502 to which is secured a probe card interface (PCI) 504. The PCI 504 provides a mechanical and more importantly, an electrical connection, between a probe card 506 and the probe card analyzer 500. The PCI 504 connects individual or groups of probes 510 to testing circuitry (not shown) for sending electrical signals through the probes and for receiving the resulting signals to determine whether they operate properly.

The support plate 502 may be rotated about a hinge 503 to position the probe card 506 secured thereto in either a downward facing or "live bug" orientation, as illustrated in FIG. 7A, or an upward facing or "dead bug" orientation, as illustrated in FIG. 7B. In the live bug orientation, the probes 510 of the probe card 506 may be physically and electrically inspected. Typically this was done with the probe card analyzer 500 that determined an alignment of the probes 510 (XYZ at two states) and various physical and electrical characteristics including, but not limited to probe resistance, capacitance, probe force, channel tests, leakage, and component tests. The probe card analyzer 500 is also capable of performing cleaning of the probes 510 and allows for manual rework or repair of the probes 510. The support plate 502 is capable of positioning the probe card 506 such that a microscope or camera C can image the probes 510 and provide an operator with a close up view of the probes to facilitate rework or repair.

As seen in FIG. 6, the probe card interface 504 supports the probe card 506 and provides a point of connection between the probes 510 of the probe card 506 and an electrical testing system (not shown) of the probe card analyzer 500. As each probe card interface 504 is peculiar to each probe card 506, otherwise electrical connection and testing would not be possible, it is necessary for a user of probe cards 506 to have at least one probe card interface 504 for each type of probe card 506 that is in use. Where multiples of each type of probe card 506 are in use, throughput issues may require that multiple probe card interfaces 504 be procured, stored and then put into use when needed. For example, where 20 probers are in use electrically testing semiconductor devices, there may not be more than one extra probe card 506, if any, to replace a probe card 506 that is not functioning properly. If two or more probe cards 506 are down at one time, it is necessary to get them running again as soon as possible. Performing maintenance on two or more probe cards 506 simultaneously on respective probe card analyzers 500 may be needed to avoid costly down time and traditionally this has always required multiple probe card interfaces 504 be available. However, it has recently been determined that probe card interfaces 504 are not necessary in all cases. In some instances, review and repair of the probe card 506 may require only a limited number or type of more mechanically oriented tests (e.g., planarity, alignment, scrub) which can be carried out without need for the highly complex and costly probe card interface 504 mechanisms.

Figure 11A:
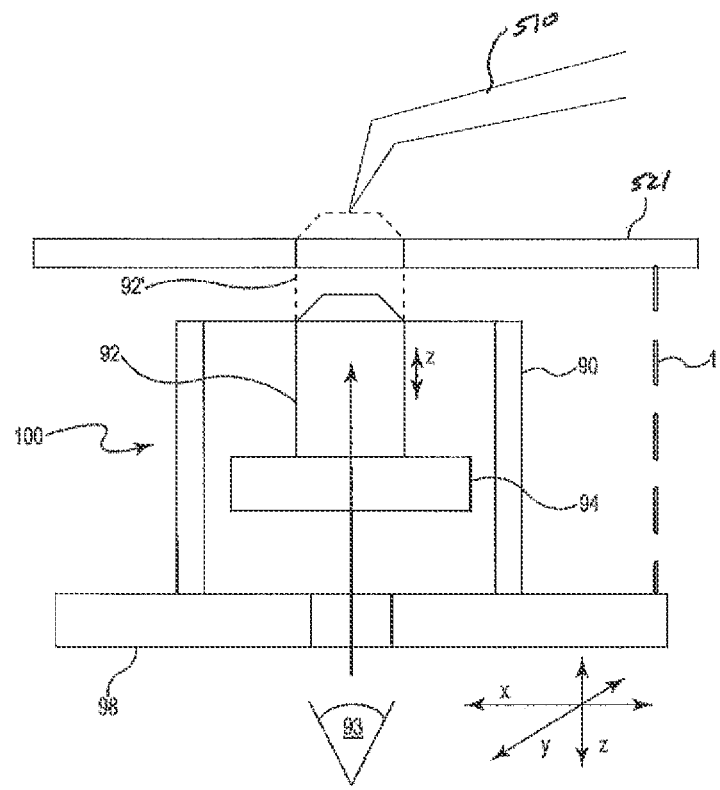
FIG. 11A is a schematic view of the inspection device illustrated in FIG. 1 and a probe.
Figure 11B:
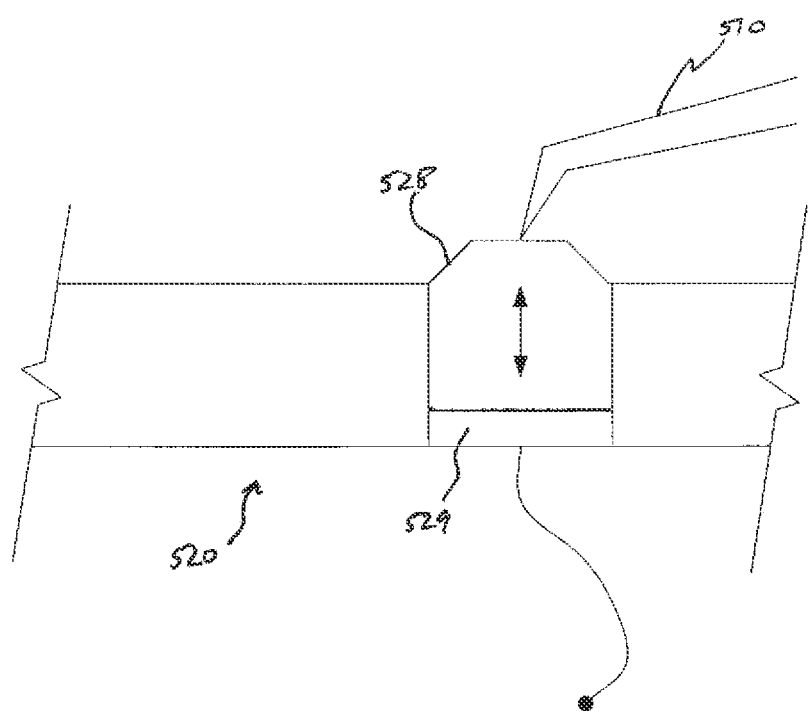
FIG. 11B is a partial schematic view of an embodiment of a sensor head of a probe card analyzer according to the present disclosure.

In accordance with aspects of the present invention, a probe card analyzer 501 that does not include a probe card interface is shown in FIGS. 8 and 9. A probe card 506 is secured to the support plate 502 either directly, as illustrated in FIG. 8, or by means of an adapter 532, as illustrated in FIG. 9. In both embodiments, the probe card 506 may be addressed to a sensor head 520 of the probe card analyzer 501. The sensor head 520 may include one or a combination of different sensors or mechanisms useful for analyzing the performance of a probe card 506. Generally, a sensor head 520 is moveable in an XY plane that is intended to be substantially parallel to the plane nominally defined by the tips of the probes 510 of the probe card 506. In some embodiments, the sensor head 520 is moveable toward and away from the probe card 506 such that the tips of the probes 510 may contact selected portions of a check plate 521 that may be part of the sensor head 520. In other embodiments, the sensor head 520 may be positioned adjacent the probes 510 of the probe card 506 which are then sequentially contacted by an inspection device 100 such as that described in conjunction with FIG. 1, and as further illustrated in FIG. 11A. In another embodiment, as illustrated in FIG. 11B, the probes 510 may be brought into contact with a post 528 that is part of the sensor head 520, the post 528 being adapted to measure a force exerted between the post 528 and the probe or probes 510 that are in contact therewith. In this manner, force-based planarity is determined with the post 528 measurements without electrical contact (i.e., without the PCI 504). The post 528 also provides measurement of loop back probes, for example. The sensor head 520 may include a check plate 521, an inspection device 100, and/or a post 528. Note that the sensor head 520, as a whole or other parts thereof, such as the inspection device 100 or the post 528, may include a load cell type elements 529 for measuring forces exerted by one or more probes. In this embodiment, a separate post 528 is unnecessary. In yet other embodiments, the check plate 521 of the sensor head 520 may contact multiple probes 510 at one time.

Regarding the sensor head 520 and the check plate 521, an inspection device 100 and/or a post 528 that may form a part thereof, it is to be understood that each of these devices are or may be constructed and arranged to conduct electricity or electrical signals. With respect to the check plate 521, common versions are formed from a metallic material such as carbide that is both wear resistant and electrically conductive. Other versions may be formed from glass plates (fiducial plates) of sufficient thickness to retain rigidity and which are provided with electrically conductive coatings. The post 528 may, like the inspection device 100, be provided with a conductive coating or may itself be made of a conductive material that is electrically isolated from the remainder of the sensor head 520 in which it is installed. Each of these structures may be electrically coupled to a device for recording and/or processing such signals, e.g. a computer, controller, or processor of a type commonly used to control stand alone or networked semiconductor inspection, metrology and processing tools. In one instance, a personal computer having the appropriate input/output communications facilities is used.

In operation, the sensor head 520 that is addressed to the probe card 506 that is secured to a support plate 502 without the use of a probe card interface 504 can perform many of the same tests or analyses that can be conducted where the probe card 506 is secured to the support plate 502 by a probe card interface 504. For example, the sensor head 520 is capable of determining the alignment of the probes 510 of the probe card 506, capturing the X, Y, and Z positions of the tip of each probe in both free hanging and overtravel positions. From this information it can be determined whether there are physical displacements of individual, groups or arrays of probes that may affect their performance during use. The amount of force exerted by one or more of the probes of a probe card may also be measured using the sensor head 520. Cleaning of dirty probes may also be undertaken.

Because the probe card analyzer 501 does not include a probe card interface, automated electrical tests are somewhat curtailed. However, the support plate 502 offers easy physical access to the probes 510 and to the electrical circuits and components of the probe card 506 and accordingly, a user can conduct a number of manual and/or partially automated electrical analyses of the probe card 506 such as contact resistance (CRES) measurements. With reference again to FIGS. 8 and 9, portions of the probe card 506 may be connected to a ground 530. An initial probe plane can be determined with only a single connection to a ground plane of the probe card 506. Thereafter, one may apply to other portions of the probe card a manual, electrically conductive probe (not shown) to measure certain electrical characteristics of the probe card such as resistance, capacitance, and component functionality. This can be a manual, or in some embodiments, a semi-automated process. Another measurement that may be undertaken is to determine the lowest hanging probe 510 of a probe card 506 that is connected to ground 530 by determining a position of the sensor head 520 when the first grounded probe contacts the sensor head 520.

Figure 10:
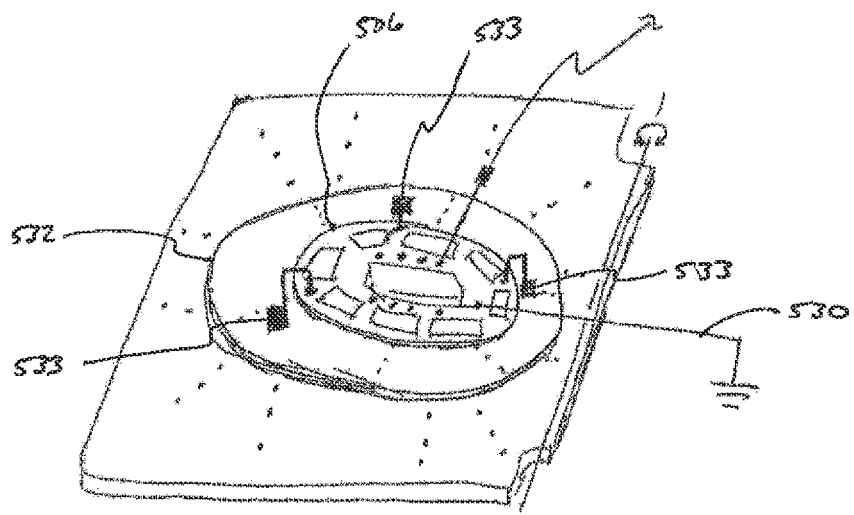
FIG. 10 is a schematic perspective view of the probe card analyzer shown in FIG. 9.

With further reference to FIG. 8, the probe card 506 may be coupled directly to the support plate 502 where the support has structures that conform to the size and shape of the probe card 506. The support plate 502 has an aperture (not shown) formed there through that permits the probes 510 of the probe card 506 to be addressed by the sensor head 520 when the probe card 506 is in its live bug orientation (see also, e.g., FIG. 7A). With additional reference to FIG. 10, the probe card 506 may be removably coupled to the support plate 502 using clamping mechanisms 533 such as bolts, clamps, detents or the like.

With reference to FIG. 9, for example, where the aperture in the support plate 502 is too large for a given probe card 506 or is the wrong shape, the probe cards 506 may be secured to the support plate 502 by securing an adapter 532 to the support plate 502. The probe card 506 may then be removably coupled to the adapter 532 for testing. In one embodiment, the adapter 532 is a simple metal bracket that is coupled to the support plate 502 and includes coupling structures (not shown) such as lands, flats, or kinematic mounts adapted for the particular probe card 506 or range of probe cards 506 being tested. Only a minimal hold-down force of the probe card 506 to the adapter 532 is needed, however in some instances it may be necessary to force compliance of the probe card 502 to the adapter 532, e.g.

where the probe card is pre-stressed or the like. The adapter 532 positions the probes 510 at a suitable working distance above (or below) the support plate 502. The adapter 532 can have an opening (not shown) that can be aligned with the aperture formed in support plate 502 that permits the probes 510 of the probe card 506 to be addressed by the sensor head 520 when the probe card 506 is in its live bug orientation (see also, e.g., FIG. 7A). Given that the probe card interface 504 can cost as much as $100,000, one can appreciate that using relatively inexpensive adapters 532 may be economically beneficial. Additionally, alignment measurements obtained using the adapter 532 correlate well with the same measurements obtained using a probe card interface 504. In one embodiment, the alignment measurements using the adapter 532 and the alignment measurements using the PCI 504 correlate to within 95% of each other.

In one embodiment, a useful life, i.e. an estimated number of iterations or uses, of the probe card 506 is defined by a user. A service interval is established for the probe card 506 during the useful life (i.e., functioning life) of the probe card 506 to establish testing by the probe card analyzer 500, 501. In one embodiment, the probe card 506 will have a first service interval established for assessing the functionality of the probe card 506 using the probe card analyzer 501 without the PCI 504 and a second service interval for accessing the functionality of the probe card 506 with the probe card analyzer 500 having a PCI 504. These service intervals may be set on an a priori basis without reference to the actual function of the probe cards themselves. However in some other embodiments it is desirable to modify service intervals or procedures based on data or criteria derived from the operation of the probe cards themselves.

In another embodiment, a baseline functionality of the probe card 506 performance can be established or determined and a service interval can be established from this baseline functionality. In other words, a first set of criteria relating to the operation of the probe card 506 can be defined and a limited analysis of the probe card 506 conducted with the probe card analyzer 501, with or without the adapter 532, based on the first set of criteria. A second set of criteria relating to the operation of the probe card 506 can also be defined and a more complete analysis of the probe card 506 conducted with the probe card analyzer 500 including PCI 504 based on the second set of criteria.

Deployment of the adapter 532 alongside, or in lieu of, the probe card interface 504 may take many forms. In one embodiment, a number of similar probe cards 506 used in electrical test systems, i.e. probers, are monitored over time. Criteria related to the performance of the probe cards 506 are measured and assessed to determine whether the probe cards 506 are performing appropriately. Criteria may include, but are not limited to: repetitive failures of devices tested by specifics portions of the particular probe card 506 (indicative of damaged probes or circuitry in a particular area of the probe card); reductions in yield in devices tested where the reductions are not corroborated by similar probe cards 506 (indicative of a probe card that is generally not performing to standard); electrical test values that deviate from standard values (indicative of degradation of probe card functionality due to corrosion, debris, or degeneration of probe card components); probe mark optical inspection results (indicative of alignment issues); and electrical and optical inspection information obtained directly from spot checks by the prober itself. Other criteria and information may be obtained or derived as needed. In any case, where the obtained data is indicative of a failure that requires extensive electrical testing for diagnosis or repair, a standard probe card interface 504 may be used to test and repair the probe card 506. In other instances, the obtained data may be determined to describe a more modest problem, such as where the probe card 506 has deformed probes; in this case a simple adapter may be used. Note that it is often the case that multiple probe card analyzers are set up to perform analysis on similar probe cards in parallel. In these cases, it is much more inexpensive to use multiple probe card analyzers 501 fitted with adapters 532 with few or even no probe card analyzers 500 fitted with probe card interfaces 504 to maintain the probe cards.

In other settings, probe card analyzers 500 having probe card interfaces 504 are used to analyze probe cards 506 that exhibit malfunctions whereas probe card analyzers 501 outfitted with adapters 532 are used for more mundane periodic and planned maintenance checkups. For example, a given probe card 506 may have established one or more service intervals at which time basic physical and electrical checks of the type that may be performed on a probe card analyzer 501 having an adapter 532 are conducted. More significant problems with probe cards 506 that arise outside of the established service interval regime may be assessed using a probe card analyzer 500 outfitted with a full probe card interface 504, if one is provided.

In yet other settings, only the probe card manufacturer will maintain a complete probe card interface 504 for a given probe card design. This probe card interface may be used to fully qualify one or more probe cards 506 that are then shipped to remote locations at which a complete probe card interface 504 is not available. Probe card analyzers 501 outfitted with adapters 532 may be used to perform analysis and maintenance on site.

Although the present disclosure has been described with reference to preferred embodiments, workers skilled in the art will recognize that changes can be made in form and detail without departing from the spirit and scope of the present disclosure.

What is claimed is:

1. A method of assessing functionality of a probe card, comprising:
   providing a probe card analyzer without a probe card interface;
   removably coupling a probe card having probes to a support plate of the probe card analyzer;
   aligning a sensor head of the probe card analyzer with the probe card; and
   measuring a characteristic of a component with the sensor head.

2. The method of claim 1, further comprising:
   mounting an adapter to the support plate, wherein the adapter is configured to accommodate the mounting of various probe card configurations; and
   removably coupling the probe card to support plate with the adapter.

3. The method of claim 1, wherein the probe card is removably coupled directly to the support plate.

4. The method of claim 1, further comprising:
   rotating the support plate to position the probe card to an upward facing orientation.

5. The method of claim 1, wherein aligning the sensor head includes repositioning the sensor head in along an XY plane.

6. The method of claim 1, wherein the component of the probes is assessed at a first service interval.

7. The method of claim 1, wherein measuring a component includes contacting tips of the probes of the probe card against a check plate of the sensor head.

8. The method of claim 1, wherein a post of the sensor head is configured to measure a force exerted between the post and the probe.

9. The method of claim 1, wherein a post of the sensor head is movable along a z-axis.

10. The method of claim 1, wherein the sensor head includes a check plate, and further wherein the sensor head is moveable independent of the support plate at least in an XY plane that is substantially parallel to a plane nominally defined by tips of the probes.

11. A method of assessing a probe card, comprising:
providing a probe card analyzer including a support plate and a sensor head;
coupling an adapter to the support plate;
coupling a probe card having probes to the adapter;
addressing the probe card with the sensor head through an aperture of the support plate and through an aperture of the adapter; and
performing a mechanical measurement of the probes.

12. The method of claim 11, wherein performing a mechanical measurement comprises:
capturing a three-dimensional position of a tip at least one probe.

13. The method of claim 12, wherein capturing the position of the tip includes capturing the free hanging position.

14. The method of claim 13, wherein capturing the position of the tip includes capturing an overtravel position.

15. The method of claim 12, comprising determining physical displacement of at least one probe.

16. The method of claim 11, further comprising manually manipulating an electrically conductive probe relative to the probe card to measure at least one of the group of resistance, capacitance, and component functionality.

17. The method of claim 11, comprising determining a lowest hanging probe of the probe card by determining a position of the sensor head when a first ground probe contacts the sensor head.

18. A method of monitoring a probe card, comprising:
establishing a first service interval for a probe card;
establishing a second service interval for the probe card;
removably coupling the probe card to a probe card analyzer by means of a probe card interface at a defined point of the first service interval and assessing the probe card at least partially using the probe card interface; and,
removably coupling the probe card to a probe card analyzer having no probe card interface at a defined point of the second service interval and assessing the probe card.

19. The method of claim 18, further comprising removably coupling the probe card to the probe card analyzer by means of an adapter.

20. The method of claim 18, further comprising establishing the first service interval by determining a baseline performance of the probe card using the probe card interface.

21. The method of claim 18, wherein the first service interval is established based on a first set of criteria relating to an operation of the probe card and the second service interval is established based on a second set of criteria relating to the operation of the probe card.

22. The method of claim 21, wherein the first set of criteria relates at least in part to a performance of the probe card and the second set of criteria relates at least in part to a usage of the probe card.

* * * * *